(12) United States Patent
Frantz

(10) Patent No.: US 6,987,436 B2
(45) Date of Patent: Jan. 17, 2006

(54) METHOD FOR FRINGE FIELD COMPENSATION OF AN ACTIVELY SHIELDED SUPERCONDUCTING NMR MAGNET

(75) Inventor: Wolfgang Frantz, Karlsruhe (DE)

(73) Assignee: Bruker Biospin GmbH, Rheinstetten (DE)

( * ) Notice: Subject to any disclaimer, the term of this patent is extended or adjusted under 35 U.S.C. 154(b) by 42 days.

(21) Appl. No.: 10/926,978

(22) Filed: Aug. 27, 2004

(65) Prior Publication Data
US 2005/0068033 A1 Mar. 31, 2005

(30) Foreign Application Priority Data
Sep. 27, 2003 (DE) ......................................... 103 44 983

(51) Int. Cl.
*G01R 33/421* (2006.01)

(52) U.S. Cl. ........................ 335/216; 335/299; 335/301; 324/319; 324/320

(58) Field of Classification Search ................ 335/216, 335/299, 301; 324/318–320
See application file for complete search history.

(56) References Cited

U.S. PATENT DOCUMENTS

| | | | | |
|---|---|---|---|---|
| 5,329,266 A | * | 7/1994 | Soeldner et al. | 335/216 |
| 6,265,960 B1 | * | 7/2001 | Schauwecker et al. | 335/301 |
| 6,369,464 B1 | * | 4/2002 | Schauwecker et al. | 307/91 |
| 2003/0094951 A1 | | 5/2003 | Schlenga | |
| 2003/0234649 A1 | | 12/2003 | Amann | |

FOREIGN PATENT DOCUMENTS

| | | |
|---|---|---|
| EP | 0 137 648 | 4/1985 |
| JP | 0 108 1207 | 3/1989 |

* cited by examiner

*Primary Examiner*—Ramon M. Barrera
(74) *Attorney, Agent, or Firm*—Paul Vincent

(57) ABSTRACT

The invention concerns a method for charging an actively shielded magnet coil arrangement (20) comprising a first partial region (21) which can be superconductingly short-circuited using an additional switch (23), and a second partial region (22), wherein the two partial regions (21, 22) generate dipole moments of different signs. The magnetic fringe field B* is measured close to the desired operating state of the arrangement (20) and operating currents are determined for each of the two partial regions (21, 22) at which the overall magnetic field B is free from an additional dipole moment caused by production tolerances to permit setting of the theoretically optimum fringe field, irrespective of production tolerances. These operating currents are adjusted taking into consideration the inductive coupling between the partial regions (21, 22) through initially charging the entire magnet coil arrangement (20) and, after closing the additional switch (23), through continuation of the charging process in the second partial region (22) only. This eliminates deviations, which are caused by production tolerances, from the optimum theoretical fringe field of the arrangement (20) in a simple and inexpensive manner.

21 Claims, 4 Drawing Sheets

METHOD FOR FRINGE FIELD COMPENSATION OF AN ACTIVELY SHIELDED SUPERCONDUCTING NMR MAGNET

This application claims Paris Convention priority of DE 103 44 983.3 filed Sep. 27, 2003 the complete disclosure of which is hereby incorporated by reference.

BACKGROUND OF THE INVENTION

The invention concerns a method for charging an actively shielded magnet coil arrangement, which is superconductingly short-circuited during operation via a superconducting main switch, in particular, of an NMR magnet, wherein the magnet coil arrangement comprises at least one first and one second partial region, wherein at least the first partial region can be separately short-circuited via an additional superconducting switch, and wherein the two partial regions generate magnetic fields during operation whose magnetic dipole moments $D^{(1)}$ and $D^{(2)}$ have opposite signs.

Actively shielded magnets have a considerably reduced magnetic fringe field outside of the magnet coil arrangement, i.e. the field strength decreases rapidly with increasing separation from the magnetic center of the magnet compared with an unshielded magnet of the same field strength. This reduced fringe field provides the following substantial advantages for the user.

1. For safety reasons, magnetic fringe fields of a certain magnitude (5 Gauss=0.5 mT) must remain within a spatial region which is inaccessible to the public. Shielded magnets considerably reduce this spatial region.
2. In addition to NMR, other measuring methods are often used in a laboratory, which are sensitive to magnetic fields (e.g. mass spectroscopy). The combination of differing measuring methods within a common, confined region, may, in some cases, only be possible using shielded magnets.
3. The number of NMR magnets within a laboratory can be considerably increased by using shielded magnets.

The planning of buildings and utilization of space is therefore much simpler and effective for actively shielded magnets compared to magnets without shielding. Magnets of a certain field strength can often only be used in a given area when the fringe field is actively shielded.

The fringe field specifications must be met for each magnet, irrespective of tolerances in the production of the magnet and of the superconducting wires. Dimensional variations in the superconducting wires change e.g. the current density in the magnet coils. These tolerances can have direct and indirect influence on the fringe field. Direct influence, in that the field portions of the shielding magnet region and of the residual magnet do not correspond to the optimum theoretical values due to tolerances, which results in deterioration of the fringe field compensation. Indirect influence, in that field inhomogeneities are generated at the NMR sample (i.e. in the magnet center) due to production tolerances, whose correction requires so-called cryoshims which, in turn, generate a fringe field which is superimposed upon that of the magnet. Both influences are substantially caused by production tolerances and therefore differ for each magnet system. To solve this problem, the specified fringe field spatial region of the magnets could be increased to such an extent that the admissible values are not surpassed despite all production tolerances. Characteristic separations are e.g. the radial and axial separations of the 5 Gauss line from the magnetic center of the coil arrangement. This procedure is, of course, greatly disadvantageous in that the theoretically possible fringe field reduction of the magnet is not utilized. The present patent provides a very simple and elegant method which permits utilization of the theoretical potential of fringe field reduction. The method permits compensation of the fringe field during charging and the correction can be adjusted to each individual magnet.

Formal description of active shielding:

The magnetic far-field region of any magnet arrangement always has a dipole character at a sufficiently large separation from the magnetic center, since the far-field is dominated by the dipole term of the multipole expansion of the magnetic field. To reduce the fringe field or the far-field of a magnet, the dipole moment of the magnet arrangement must be largely eliminated. Towards this end, an unshielded main magnet coil is augmented by a shielding section which is connected in series and is wound in an opposite sense. For an optimized, i.e. minimized fringe field, the dipole moments (D, $[D]=A*m^2$) of the shielding section (A) and the main magnet coil (H) must be approximately equal and opposite, i.e. the following must apply:

$$D_A + D_H \approx 0.$$

In this case, the fringe field is substantially determined by terms of higher order. The dipole moment of a magnet coil can be described as a product between a pure geometrical value and the coil current. The value which depends on the magnet geometry is referred to below as the dipole moment lift d ($d = \Delta D/\Delta I$, $[d]=[D/I]=m^2$). The dipole moment of the magnet coil arrangement through which a current $I_{Magnet}$ flows, can be represented as follows:

$$D = (d_A + d_H) * I_{Magnet}$$

The dipole moment lift is defined to include the winding sense of the magnetic coil and can therefore also be negative.

An additional dipole moment (D*) of a theoretically fringe-field optimized, actively shielded magnet coil arrangement results e.g. from a deviation of the dipole moment lift from the theoretical value in consequence of production tolerances. As mentioned above, charging of the cryoshim can also influence the fringe field distribution. This error may formally also be associated with an effective dipole moment lift of the overall arrangement (magnet coils+cryoshim system) for which reason the two causes are no longer distinguished below.

It is the object of the present invention to compensate, during charging of the magnet, for the additional dipole moment which is caused through production tolerances and which is different for each magnet to such an extent that the theoretically achievable minimum fringe field can be obtained during operation. The fringe field region can thereby be specified within narrower limits thereby considerably facilitating the planning of buildings and utilization of space for NMR magnets or even enabling their use in environments with limited space.

SUMMARY OF THE INVENTION

The above-described object is achieved by a method for charging a magnet coil arrangement which is superconductingly short-circuited during operation via a superconducting main switch, the magnet coil generating, in the center thereof, a homogeneous, temporally stable magnetic field B which extends in a z-direction, and a temporally stable magnetic fringe field outside of the magnet, wherein the magnet coil arrangement comprises at least one first and one second partial region, wherein at least the first partial region can be separately superconductingly short-circuited via an additional superconducting switch, and wherein the two partial regions generate magnetic fields during operation, whose magnetic dipole moments $D^{(1)}$ and $D^{(2)}$ have opposite signs, the method comprising the following steps:

(a) charging the magnet coil arrangement to a first current strength value $I_1$ while the main switch and additional switch are open using a power supply unit;

(b) measuring the fringe field B* e.g. at the radius of the theoretical, radial 5-Gauss line at the level of the magnetic center (z=0 cm) of the magnet coil arrangement and calculating the difference ΔB* between the theoretical and measured magnetic field values;

(c) calculating the additional dipole moment D* associated with the fringe field deviation ΔB* measured in step (b);

(d) determining additional currents $\Delta I^{(1)}$ and $\Delta I^{(2)}$ using the two partial regions, wherein the additional currents $\Delta I^{(1)}$ and $\Delta I^{(2)}$ are selected to generate an additional magnetic field with dipole moment −D*;

(e) calculating a second current strength value $I_2$ through the entire magnet coil arrangement, at which the additional switch is to be closed, and a third current strength value $I_3$ in the second partial region, which cannot be short-circuited with the additional switch, at which the main switch should be closed, such that, taking into consideration the mutual inductance between the two partial regions after reaching $I_3$ in the second partial region, the current distribution in the two partial regions is $$I^{(1)}=I_2+\Delta I^{(1)} \text{ and } I^{(2)}=I_3=I_2+\Delta I^{(2)},$$

wherein the theoretically targeted magnetic field B is present at the location of the NMR sample;

(f) continuing charging of the magnet coil arrangement after closing the additional switch when $I_2$ has been reached and closing the main switch when $I_3$ has been reached, wherein $I_2$ is reached before $I_3$.

For correction of the cryoshim influence, the dipole moment to be expected can be calculated on the basis of the known cryoshim geometry and the field homogeneities to be corrected—which must be previously measured, e.g. in step (b).

The basic idea of the invention is to subdivide the main magnet, i.e. the main coil of the magnet coil arrangement into at least one first and one second partial region. If the same current flows through all partial regions of the main magnet, the main magnet has an uncompensated additional dipole moment, which is associated with an undesired excessive fringe field, e.g. at the specified location of the 5-Gauss line, e.g. due to production tolerances. This excessive fringe field is initially determined through measurements (for later charging of the same magnet coil arrangement, determination of the fringe field profile of the uncompensated magnet coil arrangement must not be repeated). The two partial regions have opposite influences on this fringe field. Due to the inventive method, a non-vanishing current difference of $\Delta I^{(2)}-\Delta I^{(1)}$ between the two partial regions is set at the end of the charging process, to reduce the magnetic fringe field and adjust the specified fringe field distribution of the magnet coil arrangement. This permits compensation of the excessive fringe fields which occur due to production tolerances. The inventive method requires only one power supply unit for charging the entire magnet coil arrangement, which reduces the costs of the magnet coil arrangement.

One variant of the inventive method is advantageous, wherein, after step (f), the power supply unit and the magnet coil arrangement are disconnected. This relieves the power supply unit and reduces the operating costs of the magnet coil arrangement.

One method variant is particularly preferred, wherein the magnet coil arrangement comprises a supplemental switch for separately superconductingly short-circuiting the second partial region which cannot be short-circuited by the additional switch. This permits more flexible handing of the magnet coil arrangement during the charging process, i.e. through free selection of the partial region which is to be initially short-circuited.

In one advantageous design of this method variant, the supplemental switch is closed after step (f). This reduces the heat input into the cooling medium, generally a helium (He) bath, and therefore reduces the He consumption since keeping a switch open is usually associated with heat input by a heater.

One method variant is also preferred, wherein $|I_1-I_2|\leq 0.05|I_2|$. The magnetic fringe field B* is thereby measured in a current strength region and therefore in a magnetic field strength region close to the final operating state and therefore with high accuracy. External disturbances which influence the magnetic field (e.g. ferromagnetic installations in the surroundings) have approximately the same strength during measurement as during operation.

One method variant is also preferred wherein $|I_2-I_3|\leq 0.05|I_2|$. The current difference between the partial regions is therefore small compared to the absolute current in one of the partial regions. This helps to prevent overload of a superconducting wire in one of the partial regions.

In one particularly preferred variant of the inventive method, the magnet coil arrangement is subdivided into two partial regions such that an optimum dipole moment lift d, in particular, a maximum dipole moment lift d is generated in the two partial regions, wherein the dipole moment lift d designates the change of the dipole moment D per current strength variation ΔI in accordance with d=ΔD/ΔI. The magnet coil arrangement may e.g. thereby be subdivided into two partial regions such that the sum of the magnitudes of the dipole moment lifts $|d^{(1)}|+|d^{(2)}|$ is maximum. A subdivision which can be universally used provides $d^{(1)}\cong-d^{(2)}$. If the value of the dipole moment lift d in the two partial regions is relatively large, in particular by selecting the shielding section as the first partial region of the magnet coil arrangement, the dipole moment can already be compensated for with relatively small additional currents and the charging process may be greatly accelerated thereby preventing possible excess current in the superconductor. If only one power supply unit with little adjustment accuracy is available, more precise compensation of the dipole moment can be obtained through selection of partial regions with a lower absolute value of the dipole moment lift.

In a preferred method variant, the additional currents $\Delta I^{(1)}$ and $\Delta I^{(2)}$ in the two partial regions differ by at least a factor of 5 after $I_3$ has been reached. In this case, the partial region with the additional current having the higher value substantially provides the compensation. This simplifies the procedure.

In one preferred design of this variant of the inventive method, the first partial region which can be short-circuited using the additional switch, has the additional current with the smaller value after reaching $I_3$. This means $|\Delta I^{(1)}|<|\Delta I^{(2)}|$. In this case, the power supply current can be adjusted with greater accuracy.

In an alternative design of this variant of the inventive method, the second partial region has the additional current with the smaller value after reaching $I_3$, i.e. $|\Delta I^{(1)}|>|\Delta I^{(2)}|$. This prevents excessive current in the superconductor of the second partial region.

In a further preferred method variant, the coupling K between the partial regions is smaller than 0.9, preferably smaller than 0.5. The coupling thereby means the quotient between the magnetic field changes in the observed fringe field region of the two partial regions which is generated by a (power supply) current change in one partial region (e.g. the second partial region), i.e. $K=|\Delta B^{(1)}|/|\Delta B^{(2)}|$. With a coupling of 1, the overall magnetic field B could not be changed by a current change in one of the partial regions. With a coupling strength of zero, the partial regions would be completely decoupled. With the inventive low coupling, the magnetic field can be adjusted with small current changes.

In a particularly preferred design of this method variant, the two partial regions are inductively decoupled. This greatly facilitates compensation of dipole moments, since the coupled differential equations governing the coupling must not be solved in order to determine the additional currents.

In a preferred method variant, $I_2<I_3$ when the additional switch is closed during operation. In this case, positive dipole moments can be compensated for a short-circuited first partial region of the magnet with negative dipole moment lift d and negative inductive coupling M with the residual magnet.

In an alternative method variant, $I_2>I_3$ when the additional switch is closed during operation. In this case, negative dipole moments can be compensated for after reaching $I_2$ and after closing of the additional switch across the first partial region of the magnet with negative dipole moment lift d and negative inductive coupling M with the residual magnet through discharging to $I_3$.

In one particularly preferred variant of the inventive method, the magnet coil arrangement comprises, in addition to the first and second partial regions, at least one further third partial region which can be separately superconductingly short-circuited using a further additional switch. The third partial region makes the magnet coil arrangement more flexible. The additional partial region may be used e.g. to increase the accuracy of compensation of the dipole moments or for compensation of fringe field orders higher than the dipole order.

In one advantageous design of this method variant, the method steps (a) through (f) between closing the additional switch and closing of the main switch are repeated in step (f), wherein in the repeated run, the third partial region and the further additional switch with which the third partial region can be superconductingly short-circuited take the place of the first partial region and the additional switch for superconductingly short-circuiting the first partial region. The fringe field is preferably remeasured after adjustment of the current strength in the first partial region. The second and third partial regions can then be charged in accordance with the invention analogously to charging the first and second partial region of a simple, two-region magnet coil arrangement, as described above. Different orders preferably dominate the fringe field in the two partial regions which can be additionally short-circuited. This facilitates the compensation method through separation of the compensation parameters, i.e. the respective additional currents in the partial regions.

In a further sub-variant of the above-mentioned method variant, the first partial region effects rough compensation and the third partial region effects fine compensation of the dipole moment. The fringe field is measured between closings of the additional switches. Subdivision of compensation into rough and fine adjustment improves the overall accuracy of the dipole compensation which can be obtained.

Further advantages of the invention can be extracted from the description and the drawing. The features mentioned above and below may be used in accordance with the invention either individually or collectively in arbitrary combination. The embodiments shown and described are not to be understood as exhaustive enumeration but have exemplary character for describing the invention.

DESCRIPTION OF THE PREFERRED EMBODIMENT

Magnet coil arrangements, e.g. solenoidal coils, generate a spatially decreasing magnetic field B outside of the magnet coil arrangement, which is referred to below as the fringe field. The magnetic field may be represented by a so-called multipole expansion. For sufficiently large separations from the magnetic center, the fringe field is substantially described by the term of second order, the so-called dipole portion, wherein this dipole portion is proportional to the dipole moment D of the magnet coil arrangement. The following description refers to this term but can principally also be applied to terms of higher order.

For effective shielding of the fringe field of a magnet coil, an additional coil (shielding coil) is connected in series with the coil to be shielded. This shielding coil generates a magnetic field which is oriented oppositely to the coil to be shielded. The substantial advantage of shielded magnets is the improved utilization of space. The characteristic value, which is essential for fringe-field reduced magnets, is the so-called 5-Gauss line. Magnetic fields which are larger than 5 Gauss ($=0.5*10^{-3}$ tesla) must have limited public access. For this reason, this value is very important for the planning of buildings and laboratories.

In order to achieve as effective a compensation of the fringe field as possible, the coil to be shielded and the shielding coil must have approximately equal and opposite dipole moments. The dipole moment D may be formally factored into a dipole moment lift d and a current I through the coil arrangement: $D=d*I$. The sign of the dipole moment is given by the winding direction and is included in the geometrical value "dipole moment lift".

Figure 1:
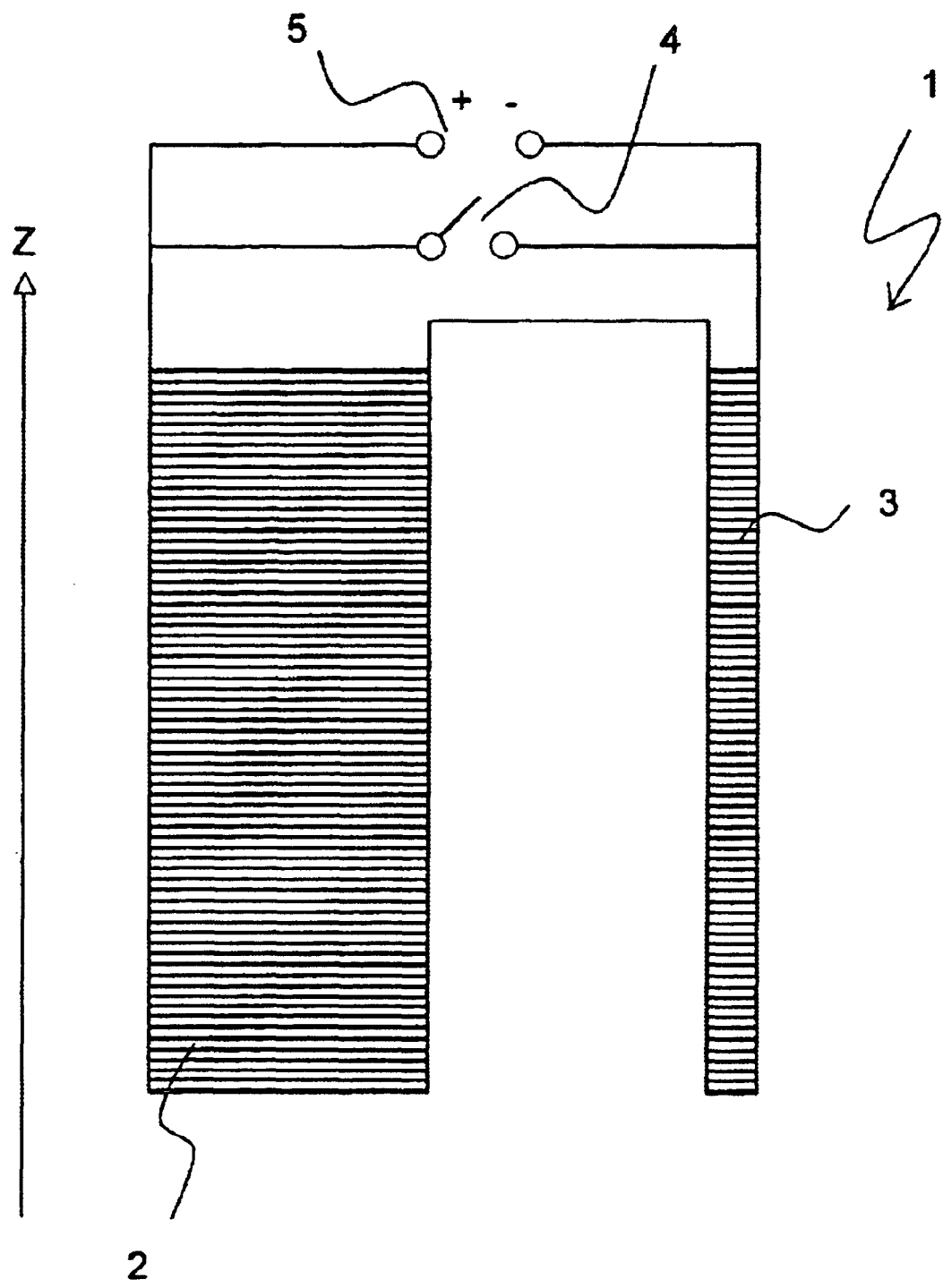
FIG. 1: shows a conventional magnet coil arrangement with shielding section and residual magnet.

FIG. 1 shows a cross-section through a half of a magnet coil arrangement which is used in conventional NMR spectroscopy. The magnet coil arrangement 1 consists essentially of one main field portion 2 and one shielding portion 3. The shielding portion may also comprise several spatially separated coil regions. The main field portion 2 and the shielding portion 3 are conventionally connected in series during operation and can be short-circuited with a common superconducting main switch 4. The main field portion 2 and shielding portion 3 are charged with a uniform current via a common power supply unit 5.

The main field portion 2 with an assumed positive winding direction generates a positive dipole moment which would substantially determine the fringe field of the unshielded main field magnet 2 at sufficiently large separations. To compensate for the fringe field outside of the magnet coil arrangement, the shielding portion 3 is designed to generate an oppositely oriented magnetic field with an approximately equal and opposite dipole moment $D^{(main\ field\ portion)} \cong -D^{(shielding\ portion)}$.

A conventional problem of the magnet coil arrangement 1 and operation of this magnet coil arrangement 1 are the production tolerances (e.g. dimensional variations of the superconducting wire) in the main field coil 2 and the shielding coil 3. These cause an additional dipole moment D* which disturbs the optimized (minimized) fringe field. At the location of the 5-Gauss line of the ideal magnet, the real magnet has fields >5 Gauss. A very simple method for compensating the additional dipole moment caused by production tolerances during charging with only one power supply unit without providing the magnet system with additional coil arrangements is described below.

Figure 2:
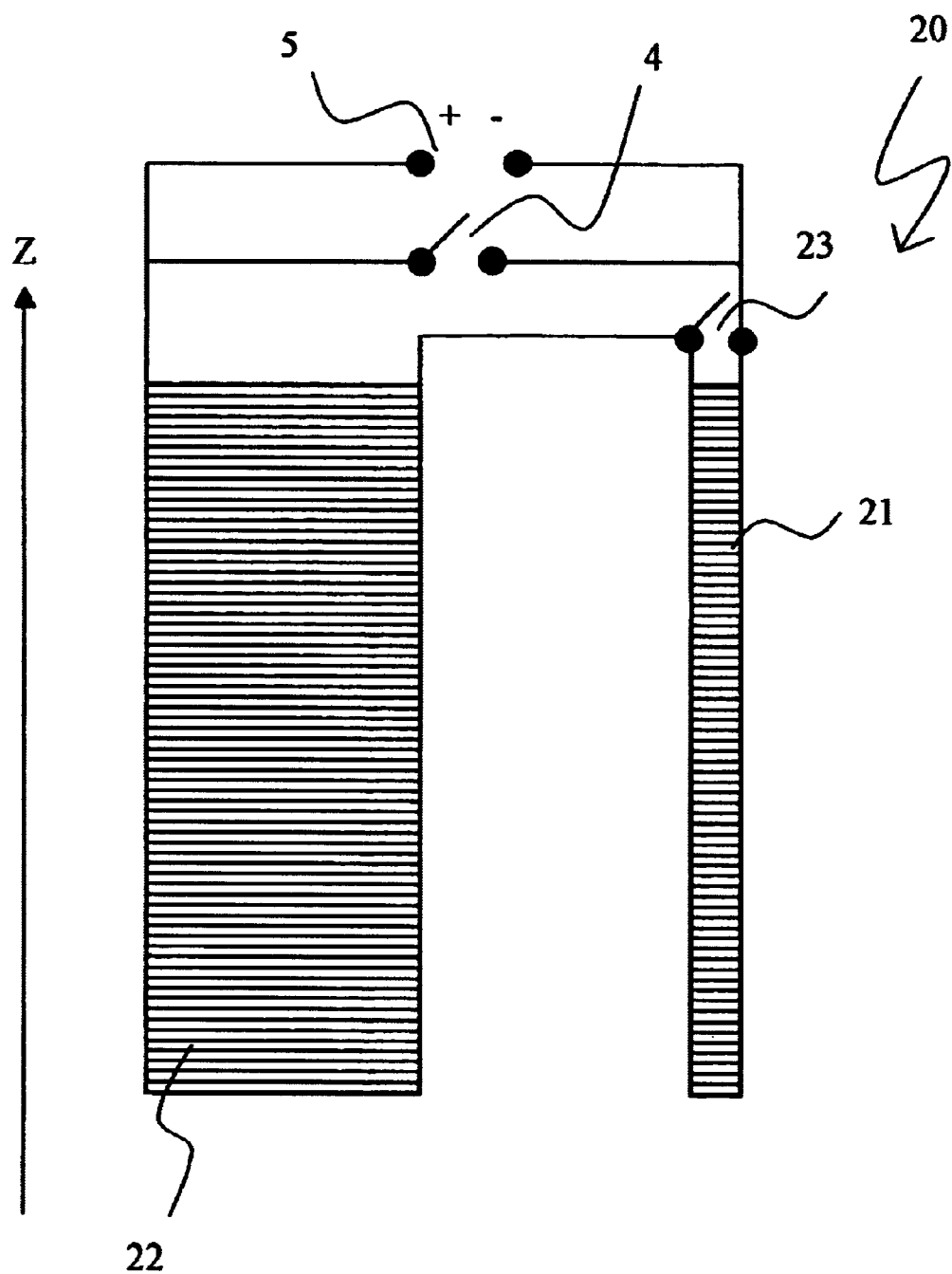
FIG. 2: shows a magnet coil arrangement with a first and a second partial region with additional switch and main switch for carrying out the inventive method, wherein the first partial region consists only of the shielding section.

The inventive teaching permits use of very simple compensation methods. FIG. 2 shows a suitable system for carrying out the inventive method.

A magnet coil arrangement 20 substantially comprises a first partial region 21 which comprises the shielding portion of the magnet coil arrangement, and a second partial region 22 which comprises the main field portion of the magnet coil arrangement 20. (This is one possible subdivision. Other subdivisions of a magnet coil arrangement 20 into partial regions are in principle possible in accordance with the invention; a first partial region may e.g. comprise main field portions and shielding portions.) The first partial region 21 and the second partial region 22 are connected in series and may be charged by a power supply unit 5. The overall magnet coil arrangement 20 can be superconductingly short-circuited using a main switch 4. The first partial region 21 can additionally be separately superconductingly short-circuited using an additional switch 23.

It is the basic idea of the inventive method to charge the first and second partial regions 21, 22 with different current strengths $I^{(1)}$, $I^{(2)}$ which is basically rendered possible by the additional switch 23. The different current fluxes in the two partial regions 21, 22 can generate a dipole moment which just compensates for the dipole moment D* caused by the production tolerances. The additional currents $\Delta I^{(1)}$ and $\Delta I^{(2)}$ in the two partial regions must be adjusted such that $$\Delta I^{(1)} * d^{(1)} + \Delta I^{(2)} * d^{(2)} = -D^*,$$

wherein the exponents indicate the partial regions.

The different currents are adjusted when charging the overall magnet coil arrangement 20, including the first partial region 21, to a current $I_2$, short-circuiting the first partial region 21 with the additional switch 23 and continuing the charging process in the second partial region 22 up to a current $I_3$. The charging process may also be continued by reducing the current flow (discharging).

Due to normally existing coupling effects, the coupling behavior of the two partial regions must be taken into consideration when determining the charging currents: If the first partial current 21 is short-circuited and the current in the second partial region 22 is increased, a counter current is generally induced in the first partial region, i.e. the current in the short-circuited first partial region changes. This coupling may be calculated while also maintaining a given magnetic field B.

The charging process is carried out as described in detail below:

1. The magnet coil arrangement 20 is set to a current $I_1$. The magnetic field $B_0^*(I_1)$ generated at this current strength is approximately of the same magnitude as the target magnetic field B, with a preferred relative deviation of less than 10%. The main switch 4 and additional switch 23 are thereby open.

2. After $I_1$ has been reached, the magnet coil arrangement is parked, i.e. the main switch 4 is closed and the power supply unit 5 is switched off. The fringe field B* is now measured e.g. at the radius of the theoretical 5-Gauss line at the level of the magnet center (z=0 cm). The additional dipole moment D* caused by production tolerances is measured from the difference ΔB* between the magnetic field value to be theoretically expected and the actually measured magnetic field value. The star indicates the result of this measurement at $I_1$. The measurement can be carried out e.g. with a Hall probe.

3. The further method parameters are determined on the basis of the measured fringe field B* (or the fringe field deviation ΔB*) and the additional dipole moment D* (caused by production tolerances) derived therefrom (when the end field B has been reached without compensation). In the description of the calculation method below, one assumes that the additional dipole moment D* determined in this manner is sufficiently close to the value of the (uncompensated) dipole moment, that differentiation between the two is unnecessary. Charging is generally performed with a power supply unit 5 current, which increases linearly with time. The points in time at which the additional switch 23 and main switch 4 should be closed must be determined in order to have the desired current strengths in the partial regions 21, 22. Closing of the additional switch 23 fixes the current in the first partial region to the value $I_2$, apart from induction influences. The point in time must be calculated at which charging of the magnet coil arrangement with short-circuited first partial region 21 must be continued (or after exceeding a target current must be discharged again) such that when the target current has been reached in the first partial region 21 (shielding portion), a dipole moment exists which just compensates for the additional dipole moment D* caused by production tolerances together with that of the second partial region 22 (main field portion). Moreover, the respective currents in the partial regions 21, 22 must produce the target magnetic field B. There are two different cases. In both cases, it is assumed that the coupling inductance between the partial region 1 (shielding portion) and the partial region 2 (main field portion) is negative; this is always true when the two partial regions contain only coil regions with opposite winding directions (partial region 1 is only wound with a negative winding sense and partial region 2 is only wound with a positive winding sense).

Case 1: the additional dipole moment of the overall system which is caused by production tolerances and which is determined from the fringe field measurement, is positive. If the first partial region 21 (shielding portion) is short-circuited at the right time and the magnet coil arrangement 20 is further charged, an additional current is induced in the short-circuited first partial region 21 which increases its negative dipole moment to such an extent that, when the end field B has been reached, the additional dipole moment caused by production tolerances is eliminated in cooperation with the direct influence of the second partial region 22 on the dipole moment.

Case 2: the additional dipole moment of the overall system which is caused by production tolerances and is determined from the fringe field measurement is negative. In this case, the target field B must be swept and the first partial region 21 must then be short-circuited. If the remaining magnetic coil arrangement 20 is discharged, an additional current is induced in the short-circuited first partial region 21 which reduces the negative dipole moment in this partial region to such an extent that the additional dipole moment caused by production tolerances is eliminated in cooperation with the direct influence of the second partial region 22 on the dipole moment after the end field B has been reached.

If, during subdivision of the partial regions, the first partial region which consists of the shielding portion, is also associated with a region of the main field portion, the inductive coupling between these two partial regions may also become positive. In this case, the above-described cases 1 and 2 will have to be correspondingly adjusted.

In both cases, the dipole moment lifts and $B_o$ field lifts of the two partial regions $b_o^{(1)}$, $d^{(1)}$, $b_o^{(2)}$, $d^{(2)}$ and the self and mutual inductances of the two partial regions would have to be included in the calculation of $I_2$ and $I_3$. This can be calculated from the coil geometries.

4. When the end field has been obtained—which is the case when $I_3$ has been reached in the second partial region—the main switch 4 is closed across the entire magnet coil arrangement (i.e. first and second partial regions). At this time, different currents flow through the first and second partial regions, i.e. $I^{(1)}=I_2+\Delta I^{(1)}$ and $I^{(2)}=I_2+\Delta I^{(2)}$, wherein $I_2$ is the current at which the additional switch was closed. The additional current $\Delta I^{(1)}$ is thereby produced exclusively through inductive coupling with the second partial region 22 and the additional current $\Delta I^{(2)}$ can be directly controlled via the power supply unit 5.

A calculation method for determining the charging parameters of an inventive charging method is shown below.

The magnet coil arrangement is subdivided into two partial regions, wherein the first partial region is superconductingly short-circuited with an additional switch after a current $I_2$ has been reached. The magnet coil arrangement is subsequently further charged with a voltage $U_o$ for a duration $\Delta t$. The values $I_2$ and $\Delta t$ must be determined such that when the main switch is closed (i.e. after expiration of $\Delta t$) the desired field B (or the desired current $I_3$) is obtained and the measured excessive stray field or the additional dipole moment caused by productions tolerances is eliminated.

Terms:
$U_o$=charging voltage after short-circuiting the first partial region.
$L^{(1,2)}$=self inductances of the partial regions 1 and 2.
M=mutual inductance between the two partial regions.
$d^{(1,2)}$=Dipole moment lifts (dipole moment per ampere) of the partial regions 1 and 2.
$b_0^{(1,2)}$=$B_o$ field lifts ($B_o$ field per ampere) of the two partial regions 1 and 2.
$b_0$=$B_o$ field lift for the entire magnet coil arrangement which is not additionally short-circuited.
$\Delta D$=additional dipole moment due to additional currents $\Delta I^{(1)}$, $\Delta I^{(2)}$.
$D^*$=additional dipole moment caused by production tolerances and evaluated in method step (c).
$\Delta B_o$=$B_o$ additional field due to additional currents $\Delta I^{(1)}$, $\Delta I^{(2)}$.

The time dependences of the two partial currents $I^{(1)}$, $I^{(2)}$ in the two partial regions after closing of the additional switch are given by the coupled differential equations:

$$L^{(1)}*dI^{(1)}/dt+M*dI^{(2)}/dt=0$$

$$M*dI^{(1)}/dt+L^{(2)}*dI^{(2)}/dt=U_o.$$

After a time interval $\Delta t$ after closing of the additional switch, the following additional currents are present:

$$\Delta I^{(1)}{}_{(\Delta t)}=-U_o*\Delta t*M/(L^{(1)}*L^{(2)}-M^2)$$

$$\Delta I^{(2)}{}_{(\Delta t)}=U_o*\Delta t*L^{(1)}/(L^{(1)}*L^{(2)}-M^2).$$

The time dependence of the additional dipole moment, caused by the additional currents, of the entire magnet coil arrangement is:

$$\Delta D_{(\Delta t)}=d^{(1)}*\Delta I^{(1)}{}_{(\Delta t)}+d^{(2)}*\Delta I^{(2)}{}_{(\Delta t)}$$

wherein with subdivision into two partial regions the following holds (with sufficient accuracy):

$$|d^{(1)}|=|d^{(2)}|$$

which leads to:

$$\Delta D_{(\Delta t)}=d^{(1)}*(\Delta I^{(1)}{}_{(\Delta t)}-\Delta I^{(2)}{}_{(\Delta t)})$$

or with the above-stated additional currents:

$$\Delta D_{(\Delta t)}=-\Delta t*d^{(1)}*U_o*(M+L^{(1)})/(L^{(1)}*L^{(2)}-M^2).$$

The following requirement determines the time interval $\Delta t$, for the duration of which the additional switch must remain closed:

$$\Delta D_{(\Delta t)}=-D^*.$$

The additional dipole moment generated by the additional currents just compensates for the additional dipole moment caused by production tolerances and determined in method step (c) on the basis of the measured fringe field, which leads to:

$$\Delta t=(D^*/d^{(1)})*(1/U_o)*(L^{(1)}*L^{(2)}-M^2)/(M+L^{(1)}).$$

In addition to the time interval $\Delta t$, which is defined through elimination of the additional dipole moment, caused by production tolerances, the point in time must also be determined at which the additional switch must be closed such that the magnet coil arrangement has its desired field ($B_0$) after expiration of the interval $\Delta t$ when the main switch is closed.

The magnetic field $B_{o,I2}$ (or the magnetic flux $I_2$), at which the additional switch must be closed is therefore defined by the following requirement:

$$B_{o,I2}=B_o-\Delta B_{o,(\Delta t)}=B_o-(b_o^{(1)}*\Delta I^{(1)}{}_{(\Delta t)}+b_o^{(2)}*\Delta I^{(2)}{}_{(\Delta t)}).$$

Using the solutions for the additional currents and $\Delta t$ derived from the required elimination of the additional dipole moment caused by production tolerances leads to:

$$B_{o,I2}=B_o-(D^*/d^{(1)})*[b_o^{(2)}*L^{(1)}/(M+L^{(1)})-b_o^{(1)}*M/(M+L^{(1)})].$$

for $I_2$:

$$I_2=B_{o,I2}/b_o.$$

Figure 3:
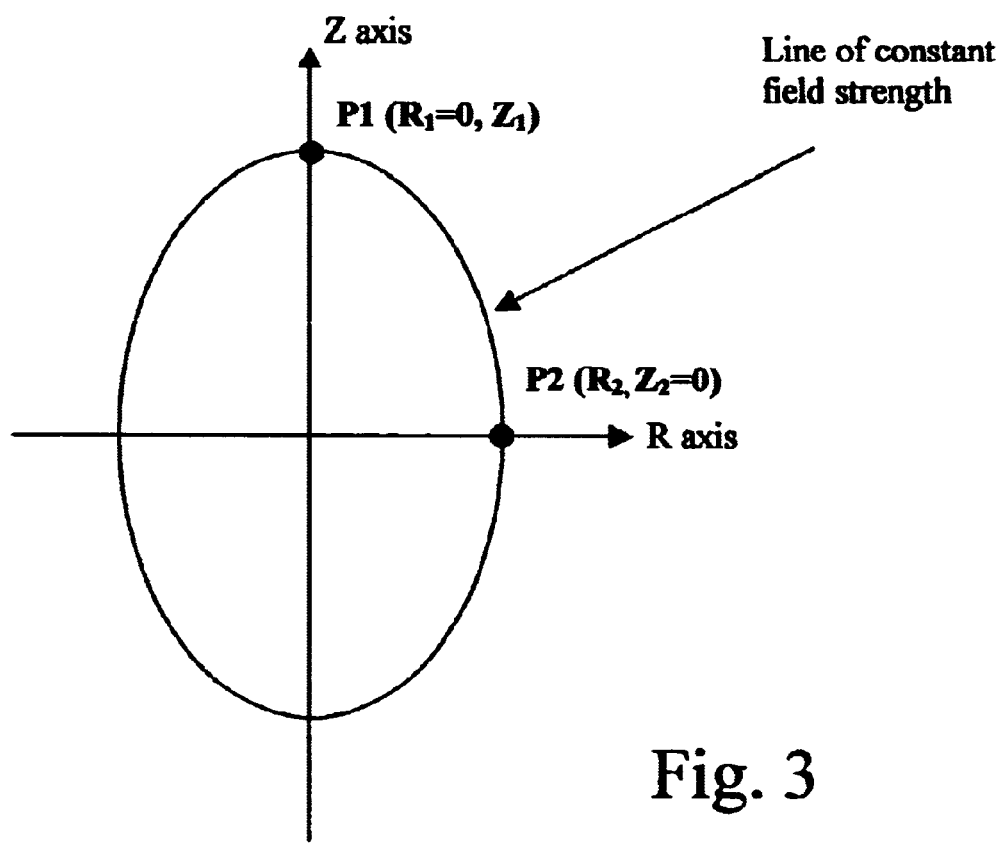
FIG. 3: shows a fringe field line of a constant magnetic field (e.g. 5-Gauss line)

Calculation of the additional dipole moment caused by production tolerances:
D=magnetic dipole moment
$\mu_o$=vacuum permeability
$B_{z(P1)}$, $B_{z(P2)}$=z component of the magnetic field at the points:
P1($R_1$=0, $Z_1$) or P2($R_2$, $Z_2$=0)
The points P1 and P2 shown in FIG. 3 designate the locations where the axial (1) and radial (P2) fringe fields are defined (the 5-Gauss line is of particular importance as mentioned above). The general formula for the z-component of the magnetic field of a dipole for points P1, P2 is given by:

$$B_z = 2 \cdot \mu_o \cdot D^* / (Z_1^3 \cdot 4\pi) \text{ für } P1(R_1=0, Z_1)$$

$$B_z = -\mu_o \cdot D^* / (R_2^3 \cdot 4\pi) \text{ für } P2(R_2, Z_2=0)$$

A dipole which is oriented parallel to the z direction has a positive dipole moment and, for a coil arrangement, a positive winding direction.

Production tolerances can cause deviations in the optimized fringe field distribution. The resulting difference $\Delta B^*_{(P2)}$ between the theoretical value and the actually measured field value at $P2(R_2, Z_2=0)$ can be associated with an additional dipole moment caused by production tolerances:

$$\Delta B^*_{(P2)} = (B_z^*_{(P2)} - B_z^{theory}_{P2})$$

$$D^* = -(4\pi/\mu_o) \cdot R_2^3 \cdot \Delta B^*_{(P2)}$$

To determine the dipole portion, $B_2^*_{(P2)}$ should be measured at a sufficiently large separation from the magnetic center of the magnet coil arrangement, i.e. $R_2$ must be sufficiently large.

Calculation of the dipole moment lifts of the magnet coil arrangement:

The dipole moment lifts of the partial regions 1 and 2 which are required for the calculation method result from division of the corresponding dipole moments by the magnetic flux: $d^{(1,2)} = D^{(1,2)} / I_{Magnet}$. The dipole moments may be calculated separately for partial regions 1 and 2 with the following formula—e.g. for point P2—using the magnet design:

$$D = -(4\pi/\mu_o) \cdot lim_{R2 \to \infty} (B_{z\,(P2)} \cdot R_2^3)$$

In the calculation, one should observe that any magnet coil arrangement has a dipole-like fringe field only in the far-field region. For calculation with the dipole formula, the value $R_2$ must be sufficiently large. Plotting of the dipole moment versus the radius $R_2$ clearly shows the convergence of the dipole moment and the radius at which the fringe field has sufficient dipole character.

The invention concerns a method for charging an actively shielded magnet coil arrangement (20) comprising a first partial region (21) which can be superconductingly short-circuited using an additional switch (23), and a second partial region (22), wherein the two partial regions (21, 22) generate dipole moments of different signs. The magnetic fringe field B* is measured close to the desired operating state of the magnet coil arrangement (20) and operating currents are determined for each of the two partial regions (21, 22) at which the overall magnetic field B is free from an additional dipole moment caused by production tolerances to permit setting of the theoretically optimum fringe field, irrespective of production tolerances. These operating currents are adjusted taking into consideration the inductive coupling between the partial regions (21, 22) through initially charging the overall magnet coil arrangement (20) and, after closing the additional switch (23), through continuation of the charging process in the second partial region (22) only. This eliminates deviations, which are caused by production tolerances, from the optimum theoretical fringe field of the magnet coil arrangement (20) in a simple and inexpensive manner.

Figure 4:
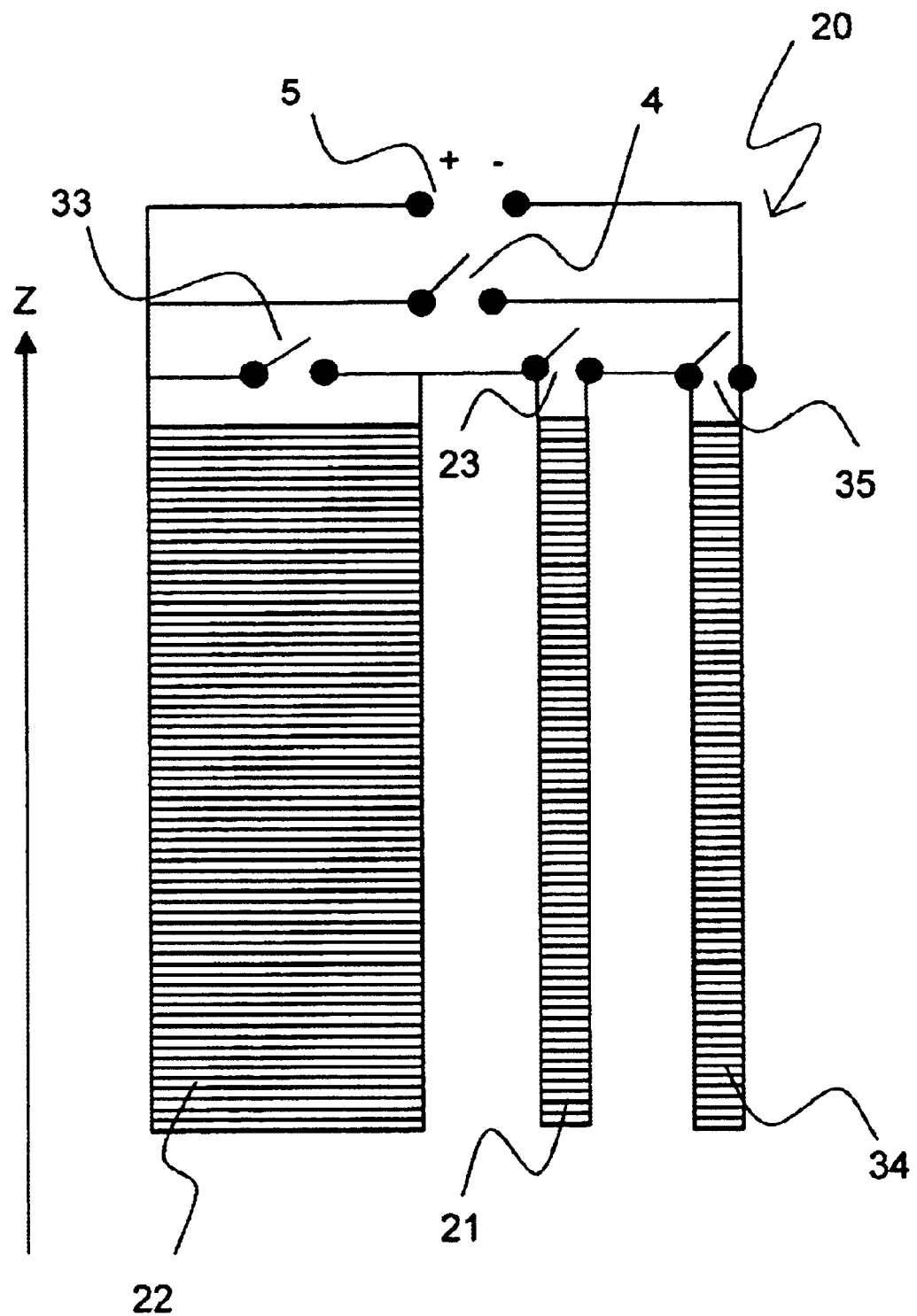
FIG. 4: shows a preferred embodiment of the invention with additional short circuiting switches.

FIG. 4 shows another preferred embodiment of the invention with which the magnet system has a supplemental switch 33 for superconductingly short-circuiting the second partial region 22 as well as a third partial region 34 which can be separately superconductingly short circuited using a further additional switch 35.

I claim:

1. A method for charging an actively shielded magnet coil arrangement which is superconductingly short-circuited via a superconducting main switch, in particular of an NMR magnet, wherein the magnet coil arrangement comprises at least one first and one second partial region, wherein the first partial region can be separately superconductingly short-circuited via an additional superconducting switch and the second partial region cannot be short circuited by that additional switch, and during operation, the first and the second partial regions generate magnetic fields whose respective magnetic dipole moments $D^{(1)}$ and $D^{(2)}$ have opposite signs, the method comprising the steps of:

a) opening the main switch and the additional switch using a power supply unit;

b) charging, following step a), the magnet coil arrangement to a first current strength value $I_1$;

c) measuring a fringe field B* at a predetermined fringe field position;

d) calculating a difference $\Delta B^*$ between theoretical and measured magnetic field values at the fringe field position to determine a fringe field deviation;

e) calculating an additional dipole moment D* associated with the fringe field deviation $\Delta B^*$ measured in step d);

f) determining additional currents $\Delta I^{(1)}$ and $\Delta I^{(2)}$ in the first and second partial regions, wherein the additional currents $\Delta I_{(1)}$ and $\Delta I^{(2)}$ are selected to generate an additional magnetic field with a dipole moment $-D^*$;

g) calculating a second current strength value $I_2$ through the magnet coil arrangement at which the additional switch is to be closed, and calculating a third current strength value $I_3$ of the second partial region at which the main switch is to be closed, such that, taking into consideration a mutual inductance between the first and second partial regions and after reaching $I_3$ in the second partial region, a respective current distribution in said first and said second partial regions is given by $$I^{(1)} = I_2 + \Delta I^{(1)} \text{ and } I^{(2)} = I_3 + \Delta I^{(2)}$$

wherein a targeted magnetic field B is also present;

h) continuing charging the magnet coil arrangement after the additional switch has been closed when $I_2$ has been reached; and i) closing the main switch when $I_3$ has been reached, wherein $I_2$ is reached before $I_3$.

2. The method of claim 1, wherein, in step c), the fringe field position is selected at a radial separation of a theoretical 5-Gauss line and at an axial position of a center of the magnet coil arrangement.

3. The method of claim 1, wherein the power supply unit is disconnected from the magnet coil arrangement after step i).

4. The method of claim 1, further comprising a supplemental switch for separately superconductingly short-circuiting the second partial region.

5. The method of claim 4, wherein the supplemental switch is closed after step i).

6. The method of claim 1, wherein $|I_1 - I_2| \leq 0.05 |I_2|$.

7. The method of claim 1, wherein $|I_2 - I_3| \leq 0.051 |I_2|$.

8. The method of claim 1, wherein the first and the second partial regions are selected such that an optimum or maximum dipole moment lift d is generated in said first and said second partial regions, wherein the dipole moment lift d designates a change of a dipole moment per current strength variation $\Delta I$: $d=\Delta D/\Delta I$.

9. The method of claim 1, wherein after $I_3$ has been reached, the additional currents $\Delta I^{(1)}$ and $\Delta I^{(2)}$ in the first and the second partial regions differ by at least a factor of 5.

10. The method of claim 9, wherein the first partial region has an additional current with smaller value after $I_3$ has been reached.

11. The method of claim 9, wherein the second partial region has an additional current with smaller value after $I_3$ has been reached.

12. The method of claim 1, wherein the first and the second partial regions are selected such that an inductive coupling between them is negative.

13. The method of claim 1, wherein the first and the second partial regions are selected such that an inductive coupling between them is positive.

14. The method of claim 1, wherein a coupling K between the first and the second partial regions is smaller than one of 0.9 and 0.5.

15. The method of claim 14, wherein the first and the second partial regions are inductively decoupled.

16. The method of claim 1, wherein $I_2<I_3$ when the additional switch is closed during operation.

17. The method of claim 1, wherein $I_2>I_3$ when the additional switch is closed during operation.

18. The method of claim 1, further comprising at least one further, third partial region which can be separately superconductingly short-circuited using a further additional switch.

19. The method of claim 18, further comprising repeating a steps a) through h) with the third partial region and the further additional switch replacing the first partial region and the additional switch.

20. The method of claim 18, wherein the first partial region causes rough compensation and the third partial region causes fine compensation of the dipole moment D*.

21. The method of claim 18, wherein the first partial region causes compensation of the dipole moment D* and the third partial region causes compensation of higher orders of the magnetic fringe field.

* * * * *